(12) United States Patent
Ikeda et al.

(10) Patent No.: US 10,003,331 B2
(45) Date of Patent: Jun. 19, 2018

(54) SEMICONDUCTOR DEVICE INCLUDING NORMALLY-OFF TYPE TRANSISTORS AND NORMALLY-ON TYPE TRANSISTOR CONNECTED SERIES

(71) Applicant: Kabushiki Kaisha Toshiba, Minato-ku (JP)

(72) Inventors: Kentaro Ikeda, Kawasaki (JP); Hiroshi Mochikawa, Hachioji (JP); Atsuhiko Kuzumaki, Kodaira (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days. days.

(21) Appl. No.: 15/386,201

(22) Filed: Dec. 21, 2016

(65) Prior Publication Data

US 2017/0104484 A1 Apr. 13, 2017

Related U.S. Application Data

(63) Continuation of application No. PCT/JP2015/076176, filed on Sep. 15, 2015.

(30) Foreign Application Priority Data

Sep. 19, 2014 (JP) .................................. 2014-190932

(51) Int. Cl.
*H03K 17/687* (2006.01)
*H03K 17/567* (2006.01)
(Continued)

(52) U.S. Cl.
CPC ....... *H03K 17/567* (2013.01); *H01L 27/0605* (2013.01); *H01L 27/0629* (2013.01);
(Continued)

(58) Field of Classification Search
CPC ............. H01L 27/0605; H01L 27/0629; H01L 29/861; H01L 29/872; H01L 29/7787; H01L 29/2003; H03K 17/567
See application file for complete search history.

(56) References Cited

U.S. PATENT DOCUMENTS 3,521,087 A * 7/1970 Lombardi ............ A61B 5/0424
128/908
5,105,251 A 4/1992 Nakayama
(Continued)

FOREIGN PATENT DOCUMENTS

JP 4-63475 2/1992
JP 2006-158185 6/2006
(Continued)

OTHER PUBLICATIONS

International Search Report dated Oct. 20, 2015 in PCT/JP2015/076176, filed on Sep. 15, 2015.

*Primary Examiner* — Kenneth B Wells
(74) *Attorney, Agent, or Firm* — Oblon, McClelland, Maier & Neustadt, L.L.P.

(57) ABSTRACT

A semiconductor device according to one embodiment includes a first normally-off type transistor including a first source, a first drain, a first gate, and a first body diode, a second normally-off type transistor including a second source connected to the first source, a second drain, a second gate connected to the first gate, and a second body diode, a normally-on type transistor including a third source connected to the first drain, a third drain, and a third gate connected to the second drain, and a diode including an anode connected to the second drain and a cathode connected to the third drain.

10 Claims, 3 Drawing Sheets

(51) Int. Cl.
*H01L 29/20* (2006.01)
*H01L 29/778* (2006.01)
*H01L 27/06* (2006.01)
*H01L 29/872* (2006.01)
*H01L 29/861* (2006.01)

(52) U.S. Cl.
CPC ...... *H01L 29/2003* (2013.01); *H01L 29/7787* (2013.01); *H01L 29/861* (2013.01); *H01L 29/872* (2013.01)

(56) References Cited

U.S. PATENT DOCUMENTS

| | | | | |
|---|---|---|---|---|
| 5,742,463 | A * | 4/1998 | Harris | H02H 9/025 361/111 |
| 6,605,978 | B1 * | 8/2003 | Halamik | G01R 19/0084 327/427 |
| 7,245,175 | B2 * | 7/2007 | Morita | H03K 17/567 327/427 |
| 7,272,043 | B2 * | 9/2007 | Liao | G11C 11/5671 365/185.17 |
| 7,852,137 | B2 * | 12/2010 | Machida | H01L 27/0605 327/427 |
| 8,300,373 | B2 * | 10/2012 | Morrish | H02H 9/025 361/91.1 |
| 8,724,273 | B2 * | 5/2014 | Morrish | H02H 9/025 327/427 |
| 9,406,673 | B2 * | 8/2016 | Curatola | H01L 27/0883 |
| 9,660,062 | B2 * | 5/2017 | Padmanabhan | H01L 24/40 |
| 2010/0321966 | A1 | 12/2010 | Mochikawa et al. | |
| 2012/0087167 | A1 | 4/2012 | Kuzumaki et al. | |
| 2013/0070487 | A1 | 3/2013 | Ozawa et al. | |

FOREIGN PATENT DOCUMENTS

| | | |
|---|---|---|
| JP | 2007-6658 | 1/2007 |
| JP | 2008-193839 | 8/2008 |
| JP | 2011-10487 | 1/2011 |
| JP | 2013-78111 | 4/2013 |

* cited by examiner

SEMICONDUCTOR DEVICE INCLUDING NORMALLY-OFF TYPE TRANSISTORS AND NORMALLY-ON TYPE TRANSISTOR CONNECTED SERIES

CROSS-REFERENCE TO RELATED APPLICATION

This application is continuation application of, and claims the benefit of priority from the International Application PCT/JP2015/76176, filed Sep. 15, 2015, which claims the benefit of priority from Japanese Patent Application No. 2014-190932, filed on Sep. 19, 2014, the entire contents of all of which are incorporated herein by reference.

FIELD

Embodiments described herein relate generally to a semiconductor device.

BACKGROUND

As a material of a next-generation power semiconductor device, a group III nitride, for example, a GaN (gallium nitride)-based semiconductor is expected. The GaN-based semiconductor device has a band gap wider than silicon (Si) and, as compared to the Si semiconductor device, can realize high breakdown voltage and low power loss.

In the GaN-based transistor, generally, a high electron mobility transistor (HEMT) structure using a two-dimensional electron gas (2D EG) as a carrier is applied. A general HEMT is a normally-on transistor that is conductive also in a case where a voltage is not applied to the gate. For this reason, there is a problem in that it is difficult to realize a normally-off transistor that is not conductive unless a voltage is applied to the gate.

In a power supply circuit or the like handling high power of several hundreds of volts to one thousand volts, a normally-off operation is required from the safety point of view. Thus, a circuit configuration realizing a normally-off operation by applying a cascode connection of a GaN-based transistor of the normally-on type and a Si transistor of the normally-off type has been proposed.

In an inverter circuit of a control system to which a motor that is an inductive load is connected, when a switching device is turned off, a reflux current flows through the switching device from the motor. In a case where the circuit configuration described above is applied to a switching device of an inverter circuit of a motor control system, a reflux current flows through a body diode of a Si transistor of the normally-off type. Since the recovery characteristic of the body diode of the Si transistor is inferior, there is concern that a loss in the inverter circuit increases due to the circuit configuration described above when the reflux current flows.

DETAILED DESCRIPTION

Figure 1:
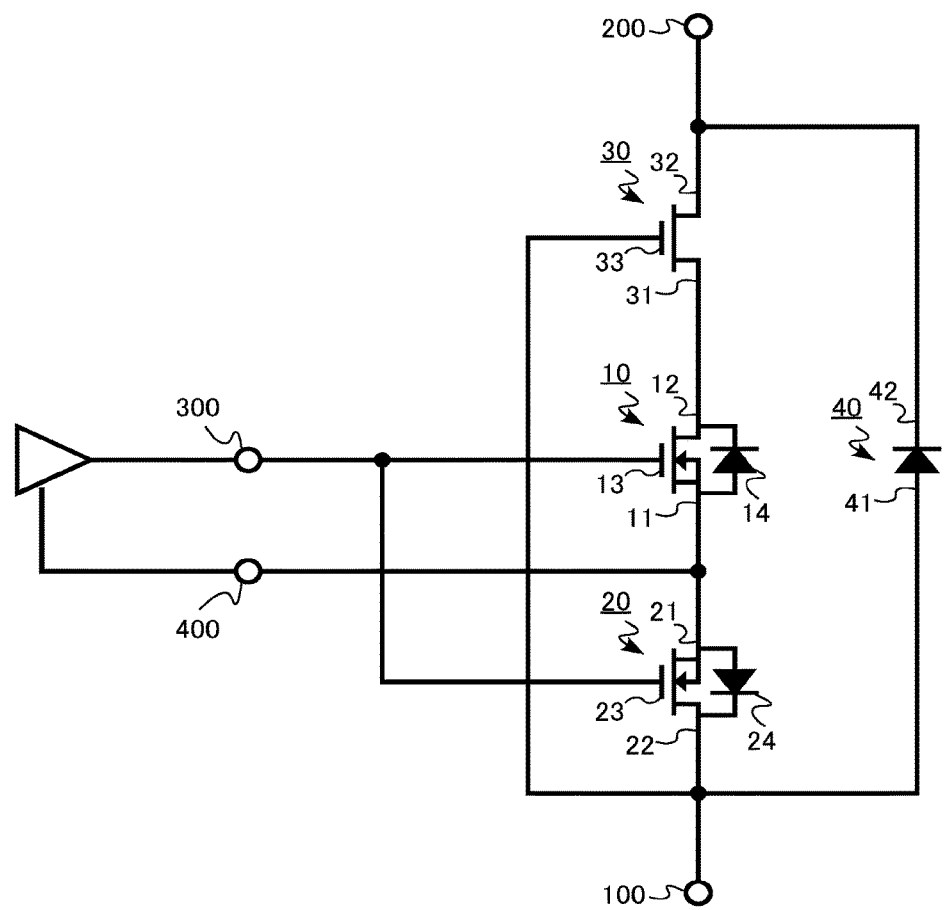
FIG. 1 is a circuit diagram of a semiconductor device according to a first embodiment.

A semiconductor device according to one embodiment includes a first normally-off type transistor including a first source, a first drain, a first gate, and a first body diode, a second normally-off type transistor including a second source connected to the first source, a second drain, a second gate connected to the first gate, and a second body diode, a normally-on type transistor including a third source connected to the first drain, a third drain, and a third gate connected to the second drain, and a diode including an anode connected to the second drain and a cathode connected to the third drain.

Hereinafter, embodiments of the present invention will be described with reference to the drawings. In the following description, the same reference numeral is assigned to the same member or the like, and a member or the like described once will not be described again as is appropriate.

In the description presented here, a semiconductor device is a device including a power module acquired by combining a plurality of devices such as discrete semiconductors, an intelligent power module acquired by embedding a chive circuit driving the devices or a self-protection function in a plurality of the devices such as discrete semiconductors, or an entire system including a power module and an intelligent power module.

In the description presented here, a "GaN-based semiconductor" is a general term of semiconductors having a composition of nitride gallium (GaN), aluminum nitride (AlN), and indium nitride (InN) and an intermediate composition thereof.

First Embodiment

A semiconductor device according to this embodiment includes a first normally-off type transistor including a first source, a first drain, a first gate, and a first body diode, a second normally-off type transistor including a second source connected to the first source, a second drain, a second gate connected to the first gate, and a second body diode, a normally-on type transistor including a third source connected to the first drain, a third drain, and a third gate connected to the second drain, and a diode including an anode connected to the second drain and a cathode connected to the third drain.

FIG. 1 is a circuit diagram of a semiconductor device according to this embodiment. The semiconductor device according to this embodiment, for example, is a power module having a rated voltage of 600 V or 1200 V.

In the semiconductor device according to this embodiment, a power module is configured by connecting a first normally-off type transistor 10 and a second normally-off type transistor 20 each being not conductive unless a voltage is applied to a gate and a normally-on type transistor 30 that is conductive also in a case where a voltage is not applied to a gate in series. Each of the first normally-off type transistor 10 and the second normally-off type transistor 20, for example, is a vertical-type metal oxide semiconductor field effect transistor (MOSFET) of silicon (Si). Each of the first normally-off type transistor 10 and the second normally-off type transistor 20, for example, is an n-type transistor in which electrons work as carriers. The normally-on type transistor 30, for example, is a gallium nitride (GaN)-based HEMT. The normally-on type transistor 30, for example, includes a gate insulating film.

The first normally-off type transistor 10 and the second normally-off type transistor 20 have a device breakdown voltage lower than the normally-on type transistor 30. The device breakdown voltage of the first normally-off type transistor 10 and the second normally-off type transistor 20, for example, is 10 V or higher and 30 V or lower. The device breakdown voltage of the normally-on type transistor 30, for example, is 600 V or higher and 1,200 V or lower.

The semiconductor device includes a source terminal 100, a drain terminal 200, a common gate terminal 300, and a common source terminal 400.

The first normally-off type transistor 10 includes a first source 11, a first drain 12, and a first gate 13 connected to the common gate terminal 300. The first normally-off type transistor 10 includes a first body diode (parasitic diode) 14.

The second normally-off type transistor 20 includes a second source 21 connected to the first source 11, a second drain 22 connected to the source terminal 100, and a second gate 23 connected to the common gate terminal 300. The first gate 13 and the second gate 23 are connected to each other. The second normally-off type transistor 20 includes a second body diode (parasitic diode) 24.

The normally-on type transistor 30 includes a third source 31 connected to the first drain 12, a third drain 32 connected to the drain terminal 200, and a third gate 33 connected to the second drain 22. The normally-on type transistor 30 does not include a body diode (parasitic diode).

In the semiconductor device according to this embodiment, the first normally-off type transistor 10 and the normally-on type transistor 30 are connected in series. In addition, the second normally-off type transistor 20 is connected to the source side of the first normally-off type transistor 10 in series in the opposite direction.

The semiconductor device includes a diode 40 that includes an anode 41 connected to the second drain 22 and a cathode 42 connected to the third drain 32. The diode 40 has a function for causing a current to flow from the source terminal 100 side to the drain terminal 200 side in a case where the voltage of the source terminal 100 is higher than that of the drain terminal 200. The diode 40 is a so-called reflux diode.

It is preferable that the diode 40 is a diode having a superior recovery characteristic. The diode 40 preferably has a recovery time shorter than that of the first body diode 14.

The diode 40, for example, is a PIN diode or a PN diode. It is preferable that the diode 40 is a first recovery diode having a superior recovery characteristic.

In addition, it is preferable that the diode 40 is a diode using wide bandgap semiconductor having a band gap wider than that of silicon (Si). A diode using the wide bandgap semiconductor can realize a breakdown voltage higher than that of a diode using Si. Examples of the wide bandgap semiconductor include GaN-based semiconductor, SiC, diamond, and the like.

The common source terminal 400 is connected to the first source 11 and the second source 21.

When the semiconductor device according to this embodiment is operated, a voltage applied to the first gate 13 and the second gate 23 is applied using the electric potential of the first source 11 and the second source 21 as the reference potential. In other words, when the semiconductor device according to this embodiment is operated, the voltage applied to the common gate terminal 300 is applied using the electric potential of the common source terminal 400 as the reference.

The semiconductor device according to this embodiment functions as a normally-off type transistor including the source terminal 100, the drain terminal 200, and the common gate terminal 300 by employing the configuration described above.

Hereinafter, the operation of the semiconductor device according to this embodiment will be described.

First, in an on state, 0 V is applied to the source terminal 100, and a positive voltage, for example, a product of on-resistance and a drain current is applied to the drain terminal 200. Then, a positive voltage with reference to the electric potential of the common source terminal 400, for example, 15 V is applied to the common gate terminal 300.

At this time, a positive voltage with reference to the electric potential of the common source terminal 400 is applied to the first gate 13 of the first normally-off type transistor 10 and the second gate 23 of the second normally-off type transistor 20. For this reason, the first normally-off type transistor 10 and the second normally-off type transistor 20 are turned on.

On the other hand, the third gate 33 of the normally-on type transistor 30 is clamped to the source terminal 100. Thus, the third gate 33 is at 0 V. Since the normally-off type transistor 10 is turned on, the third source 31 has electric potential near 0 V. For this reason, between the third source 31 and the third gate 33, a voltage that is a threshold voltage of the normally-on type transistor 30 or higher is applied. Accordingly, the normally-on type transistor 30 is turned on as well. Accordingly, an on-current flows between the source terminal 100 and the drain terminal 200.

Next, a case will be described in which the semiconductor device becomes an off state from the on state. In such a case, the voltage applied to the source terminal 100 and the drain terminal 200 does not change, but the voltage applied to the common gate terminal 300 drops from the positive voltage with reference to the electric potential of the common source terminal 400 to 0 V, for example, from 15 V to 0 V.

First, 0 V with reference to the electric potential of the common source terminal 400 is applied to the first gate 13 of the first normally-off type transistor 10 and the second gate 23 of the second normally-off type transistor 20. For this reason, the first normally-off type transistor 10 and the second normally-off type transistor 20 are turned off.

Meanwhile, the third gate 33 of the normally-on type transistor 30 is maintained to be clamped to 0 V. After the first normally-off type transistor 10 and the second normally-off type transistor 20 are turned off, the voltage of the third source 31 rises. Then, when an electric potential difference between the third source 31 and the third gate 33 clamped to 0 V arrives at a threshold voltage, the normally-on type transistor 30 is turned off. Accordingly, a current between the source terminal 100 and the drain terminal 200 is cut off.

The semiconductor device according to this embodiment operates as above and functions as a normally-off type transistor including the source terminal 100, the drain terminal 200, and the common gate terminal 300.

Hereinafter, the functions and effects of the semiconductor device according to this embodiment will be described. The semiconductor device according to this embodiment has effects of improving the recovery characteristic at a time when a reflux current flows and decreasing the power loss.

Figure 2:
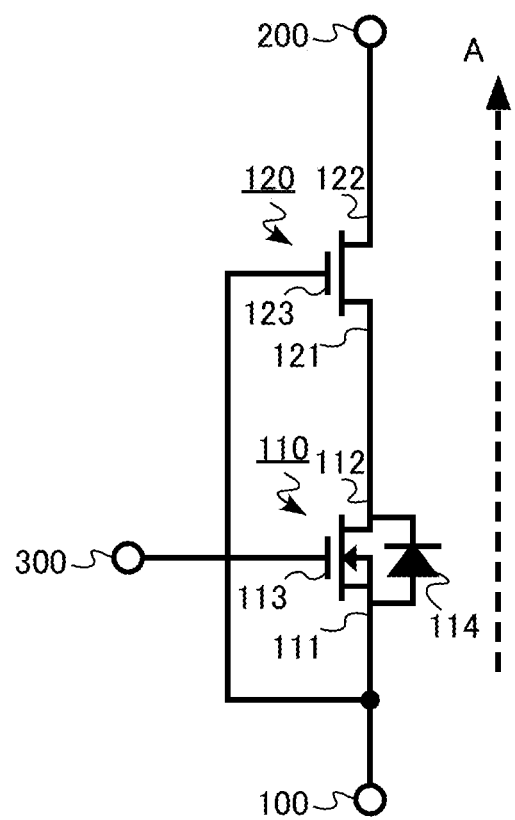
FIG. 2 is a circuit diagram of a semiconductor device of a comparative embodiment.

FIG. 2 is a circuit diagram of a semiconductor device of a comparative embodiment. The semiconductor device of the comparative embodiment has a circuit configuration in which a cascode connection is made between a normally-off type transistor 110 and a normally-on type transistor 120. The normally-off type transistor 110 and the normally-on type transistor 120 are transistors that are respectively similar to the first normally-off type transistor 10 and the normally-on type transistor 30 according to the embodiment.

The semiconductor device of the comparative embodiment includes a source terminal 100, a drain terminal 200, and a common gate terminal 300. The normally-off type transistor 110 includes a first source 111 connected to the source terminal 100, a first drain 112, and a first gate 113 connected to the common gate terminal 300. The normally-on type transistor 120 includes a second source 121 connected to the first drain 112, a second drain 122 connected to the drain terminal 200, and a second gate 123 connected to the source terminal 100.

The semiconductor device of the comparative embodiment also functions as a normally-off type transistor including the source terminal 100, the drain terminal 200, and the common gate terminal 300 by employing the configuration described above.

In the semiconductor device of the comparative embodiment illustrated in FIG. 2, for example, in a case where a reflux current flows at the time of being used as a switching device of an inverter circuit of a motor control system, in other words, in the case of a so-called reflux current mode, the source terminal 100 side has a relatively positive voltage, and the drain terminal 200 side has a relatively negative voltage. At this time, the normally-on type transistor 120 becomes the on state. Since the channel of the normally-off type transistor 110 is in the off state, a reflux current flows through a body diode 114 of the normally-off type transistor 110 in a forward direction (a direction of a dotted-line arrow A in the drawing).

In a case where the normally-off type transistor 110, for example, is a vertical-type MOSFET of silicon (Si), the body diode 114 is a PN diode. The PN diode is a bipolar device that causes a forward-direction current to flow in accordance with conductivity modulation using minority carriers. For this reason, generally, the PN diode has a long recovery time and an inferior recovery characteristic. For this reason, the recovery characteristic of the semiconductor device of the comparative embodiment is inferior as well. Accordingly, for example, in a case where the semiconductor device of the comparative embodiment is used as a switching device of an inverter circuit of a motor control system, there is a problem in that a switching loss at the time of the reflux current mode is high.

In this embodiment, at the time of the reflux current mode, a reflux current flows through the diode 40 between the source terminal 100 and the drain terminal 200. In addition, the second body diode 24 of the second normally-off type transistor 20 connected to the first normally-off type transistor 10 in the opposite direction blocks a reflux current to flow through the first body diode 14. Accordingly, the reflux current does not branch into the first body diode 14.

The diode 40 and the first and second normally-off type transistors 10 and 20 can independently select a characteristic that is appropriate to the operations of the normal operation mode and the reflux mode of the inverter circuit. Particularly, as the diode 40, a diode having a superior recovery characteristic of a recovery time shorter than that of the first body diode 14 can be used.

Thus, according to this embodiment, a semiconductor device of which the recovery characteristic at the time when the reflux current flows is improved is realized. Accordingly, for example, in a case where the semiconductor device according to this embodiment is used as a switching device of an inverter circuit of a motor control system, the switching loss at the time of the reflux mode can be suppressed.

In addition, since the branching of the current is suppressed, also when a temperature environment or the like changes, it can be suppressed that the characteristic at the time of the reflux mode becomes unstable. Furthermore, since the branching of the current is suppressed, a loss due to the first body diode 14 having an inferior characteristic can be decreased.

In addition, the on-resistance of a channel passing through the diode 40 at the time of the reflux mode can be configured to be lower than that of a channel in which the first normally-off type transistor 10, the second normally-off type transistor 20, and the normally-on type transistor 30 are connected in series. Accordingly, the conduction loss at the time of the reflux mode can be configured to be lower than that of the comparative embodiment.

As above, according to this embodiment, the semiconductor device having a low loss is realized.

Second Embodiment

A semiconductor device according to this embodiment is the same as that of the first embodiment except that the diode is a schottky-barrier diode. Thus, contents that are the same as those of the first embodiment will not be described.

Figure 3:
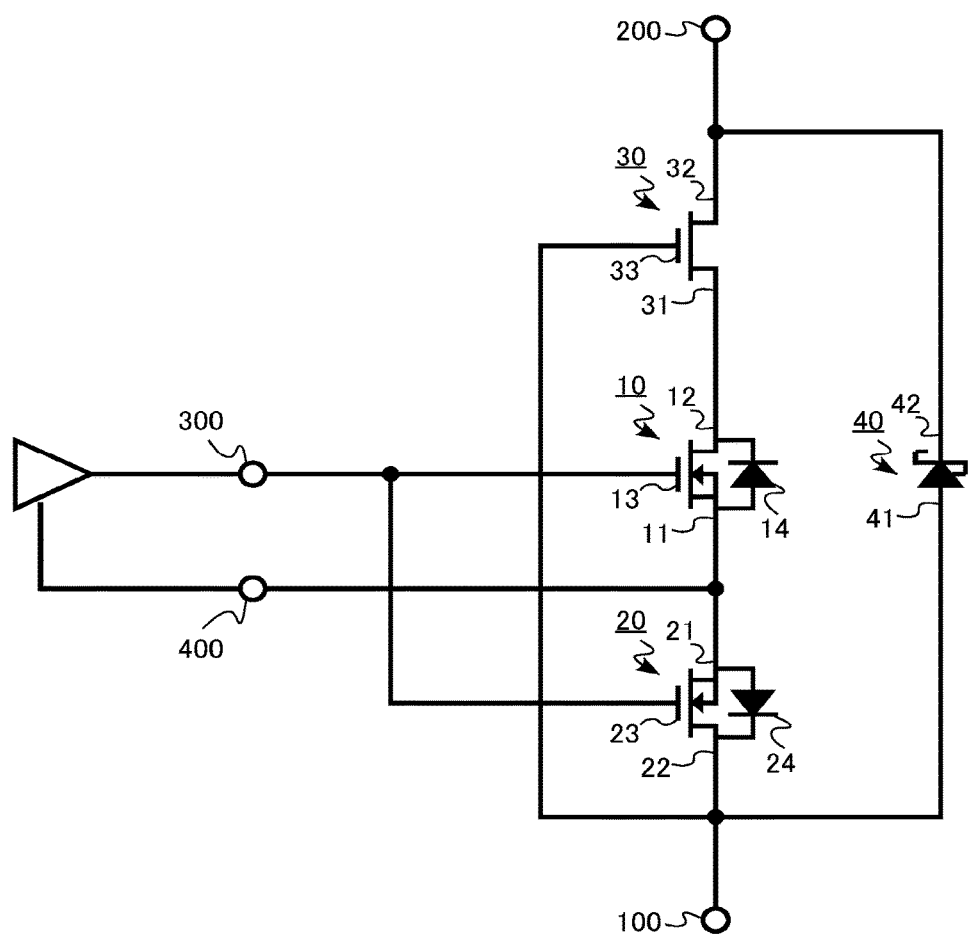
FIG. 3 is a circuit diagram of a semiconductor device according to a second embodiment.

FIG. 3 is a circuit diagram of the semiconductor device according to this embodiment. In the semiconductor device according to this embodiment, the diode 40 is a schottky-barrier diode.

The schottky-barrier diode, compared to the PIN diode or the PN diode, has a superior recovery characteristic. Thus, according to this embodiment, a semiconductor device having a further low loss is realized.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first normally-off type transistor including a first source, a first drain, a first gate, and a first body diode;
    a second normally-off type transistor including a second source connected to the first source, a second drain, a second gate connected to the first gate, and a second body diode;
    a normally-on type transistor including a third source connected to the first drain, a third drain, and a third gate connected to the second drain; and
    a diode including an anode connected to the second drain and a cathode connected to the third drain,
    wherein the second normally-off type transistor, the first normally-off type transistor, and the normally-on type transistor are connected in series in this order.

2. The device according to claim 1, wherein a reference potential of a voltage applied to the first gate and the second gate is electric potential of the first source and the second source.

3. The device according to claim 1, wherein the normally-on type transistor is a GaN-based HEMT.

4. The device according to claim 1, wherein the diode has a recovery time shorter than that of the first and second body diodes.

5. The device according to claim 1, wherein the diode is a first recovery diode.

6. The device according to claim 1, wherein the diode is a schottky-barrier diode.

7. The device according to claim 1, wherein the diode is a diode using wide bandgap semiconductor.

8. The device according to claim 1,
wherein a reference potential of a voltage applied to the first gate and the second gate is electric potential of the first source and the second source,
wherein the normally-on type transistor is a GaN-based HEMT, and
wherein the diode has a recovery time shorter than that of the first and second body diodes.

9. The device according to claim 1,
wherein a reference potential of a voltage applied to the first gate and the second gate is electric potential of the first source and the second source,
wherein the normally-on type transistor is a GaN-based HEMT, and
wherein the diode is a first recovery diode.

10. The device according to claim 1,
wherein a reference potential of a voltage applied to the first gate and the second gate is electric potential of the first source and the second source,
wherein the normally-on type transistor is a GaN-based HEMT, and
wherein the diode is a schottky-barrier diode.

* * * * *